United States Patent [19]
Eldridge et al.

[11] Patent Number: 5,601,740
[45] Date of Patent: Feb. 11, 1997

[54] METHOD AND APPARATUS FOR WIREBONDING, FOR SEVERING BOND WIRES, AND FOR FORMING BALLS ON THE ENDS OF BOND WIRES

[75] Inventors: Benjamin N. Eldridge, Danville; Gaetan L. Mathieu, Livermore, both of Calif.

[73] Assignee: Formfactor, Inc., Livermore, Calif.

[21] Appl. No.: 573,945

[22] Filed: Dec. 18, 1995

Related U.S. Application Data

[63] Continuation-in-part of Ser. No. 452,255, May 26, 1995, which is a continuation-in-part of Ser. No. 340,144, filed as PCT/US94/13373, Nov. 16, 1994, which is a continuation-in-part of Ser. No. 152,812, Nov. 16, 1993, Pat. No. 5,476, 211.

[51] Int. Cl.$^6$ ........................................................ B23K 9/06
[52] U.S. Cl. .................... 219/130.4; 219/56.21; 219/56.22
[58] Field of Search ............... 219/56.22, 56.21, 219/130.4, 69.17; 361/253, 256, 257

[56] References Cited

U.S. PATENT DOCUMENTS

| | | | |
|---|---|---|---|
| 3,214,563 | 10/1965 | Ford | 219/69.17 |
| 4,829,153 | 5/1989 | Correy | 219/130.4 |
| 5,006,688 | 4/1991 | Cross | 219/130.4 |
| 5,095,187 | 3/1992 | Gliga | 219/56.21 |

Primary Examiner—Clifford C. Shaw
Attorney, Agent, or Firm—Gerald E. Linden

[57] ABSTRACT

The efficacy of electrical discharges for severing bond wires and/or for forming balls at the ends of bond wires (including bond wires already severed by alternative mechanisms) is improved by performing the electrical discharges in the presence of ultraviolet light. A "spark gap" is formed between an EFO electrode and the wire, one of which serves as the cathode of the spark gap. Preferably, the ultraviolet light is directed at the element serving as the cathode of the spark gap. Providing photoemission at the cathode element of the spark gap stabilizes arc/plasma formation and produces more reliable and predictable results. This technique may be used in conjunction with negative EFO systems or with positive EFO systems, and may benefit from either direct or field-assisted photoemission.

34 Claims, 2 Drawing Sheets

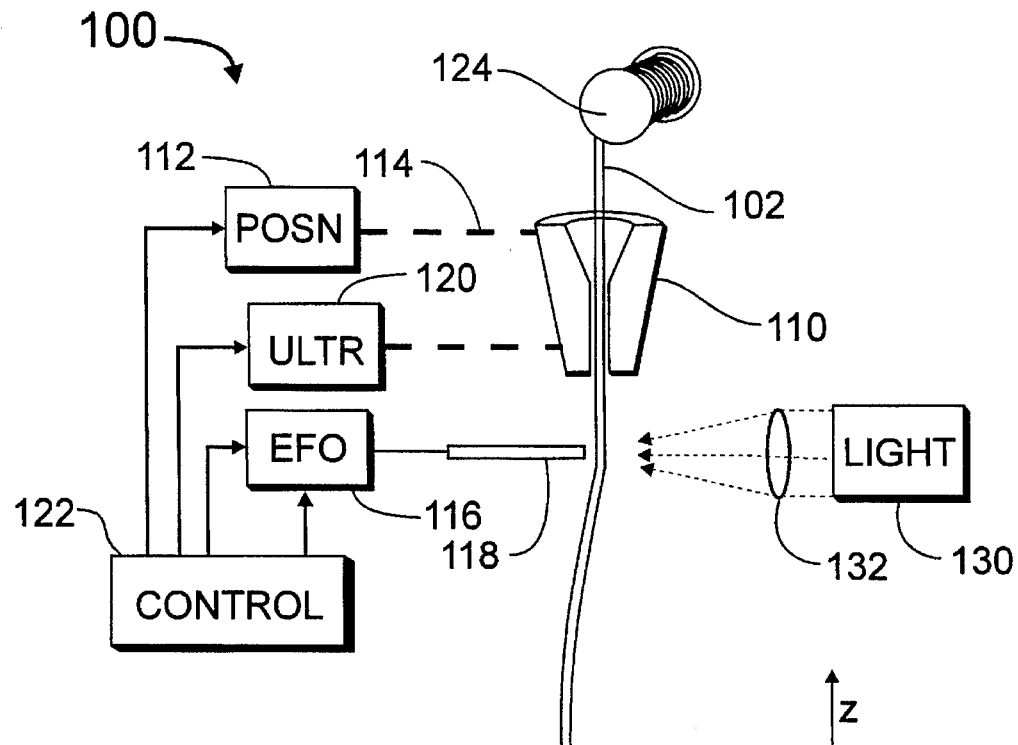
Figure 1
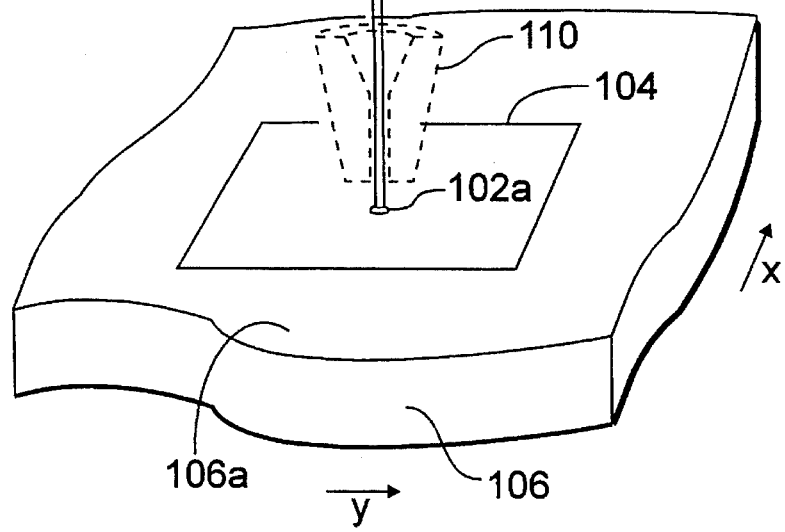
Figure 1A
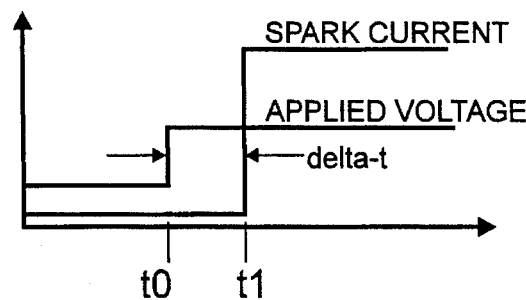

METHOD AND APPARATUS FOR WIREBONDING, FOR SEVERING BOND WIRES, AND FOR FORMING BALLS ON THE ENDS OF BOND WIRES

CROSS-REFERENCE TO RELATED APPLICATIONS

This is a continuation-in-part of commonly-owned, copending U.S. patent application Ser. No. 08/452,255 (hereinafter "PARENT CASE"), filed May 26, 1995 (status: pending), which is a continuation-in-part of commonly-owned, copending U.S. patent application Ser. No. 08/340,144 filed Nov. 15, 1994 (status: pending) and its counterpart PCT patent application number PCT/US94/13373 filed Nov. 16, 1994 (published 26 May 1995 as WO 95/14314), both of which are continuations-in-part of commonly-owned, U.S. patent application Ser. No. 08/152,812, filed Nov. 16, 1993 (status: U.S. Pat. No. 5,476,211, Dec. 19, 1995).

TECHNICAL FIELD OF THE INVENTION

The invention relates to making interconnections between electronic components, especially microelectronic components and, more particularly, to wirebonding.

BACKGROUND OF THE INVENTION

Electronic components, particularly microelectronic components such as semiconductor devices (chips), often have a plurality of terminals (also referred to as bond pads, electrodes, or conductive areas). In order to assemble such devices into a useful system (or subsystem), a number of individual devices must be electrically interconnected with one another and/or with other components, typically through the intermediary of a printed circuit (or wiring) board (PCB, PWB) or substrate.

Semiconductor devices are typically disposed within a semiconductor package having a plurality of external connection points in the form of pins, pads, leads, solder balls, and the like. Many types of semiconductor packages are known, and techniques for connecting the semiconductor device within the package include wire bonding, tape-automated bonding (TAB) and the like. In some cases, a semiconductor device is provided with raised bump contacts, and is connected by flip-chip techniques onto another electronic component. The present patent application deals primarily with making wire bond connections between two electronic components.

Due to its superior conductive and non-corrosive characteristics, gold is a "material of choice" for making electrical connections between electronic components. For example, it is well known to make a plurality of wire bond connections between conductive pads on a semiconductor die and inner ends of leadframe fingers.

The present invention advantageously employs wire-bonding equipment in which, generally, wire (e.g., gold wire) is supplied from a spool through a capillary (also referred to as a "bonding head") and is bonded to a substrate (e.g., an electronic component). Generally, the nature of the bonding head will be determined by the nature of the bond to be made thereby. When the bonding head is for making a ball bond, it will generally be a "capillary". When the bonding head is for making a wedge bond, it will generally be a "wedge", these terms having recognized meanings in the art. To simplify matters, in the main hereinafter, the term "capillary" will be employed to indicate a bonding head suitable for making either ball or wedge bonds, applying thermal energy and/or compression during bonding.

To form a traditional wirebonding loop, the capillary bears down upon a terminal of a first electronic component, bonding a free end of a wire thereto, then moves over (i.e., up, over and down) to a terminal of another electronic component, bonding the wire thereto. Then the wire is severed, in preparation for making another wire bond connection. After severing, and prior to making another wire bond connection, it is important to form a ball (broadened region, generally in the shape of a ball) on the free end of the wire projecting from the capillary. To this end, it is known to provide a spark between an electrode and the free end of the wire, which will melt the free end of the wire into a ball shape. Failure to effectively create a ball at the free end of the wire will result in failure to effect a subsequent wire bond. In automated wirebonding facilities, an entire production line can be shut down as a result of failing to produce a ball at the end of the wire. Various mechanisms are known for determining whether a ball has successfully been created at the end of the wire.

The following U.S. patents (cited, when applicable, by patent number, first named inventor, month/year of issue, and U.S. Class/Subclass), incorporated by reference herein, are cited for background purposes.

(a) U.S. Pat. No. 5,110,032 (Akiyama, et al.; 5/92; USCL 228/102), entitled METHOD AND APPARATUS FOR WIRE BONDING, discloses wire (13) supplied from a wire spool (12) through a capillary (10). (In this patent, the wire 13 is insulated.) A control unit (20) is shown which includes a CPU (processor) and a memory unit (storage for software commands). The control unit exercises control over movement of the capillary, and over a discharge power circuit (18) which, in conjunction with a discharging electrode (17) is used to sever the wire with a discharge voltage.

(b) U.S. Pat. No. 3,460,238 (Christy, et al.; 8/69; USCL 227/111), entitled WIRE SEVERING IN WIRE BONDING MACHINES, is directed to a technique whereby the wire severing operation in a wirebonder comprises moving the bonding needle (or "capillary", as used herein) with holding pressure sufficient to frictionally engage the wire and insufficient to deform the wire away from the bond area.

(c) U.S. Pat. No. 5,095,187 (Gliga; 3/92; USCL 219/68), entitled WEAKENING WIRE SUPPLIED THROUGH A WIRE BONDER, discloses wire-bonding techniques wherein a wire is bonded to a contact (terminal) on an electronic component by the application of one or a combination of heat, pressure and vibration. This patent discusses weakening or severing the wire by localized application of heat, and how the severing operation may result in a broadened portion on the severed end of the wire. The severing heat may be applied to the wire by means of an electrode from which an electric field can be made to extend to the wire such that an arc is created between the electrode and the wire. This patent describes a severing technique wherein a first portion of the arc is of a first polarity for weakening of the wire, and a second portion of the arc is of a reverse polarity for controlling dispersion of charged particles emitted from the wire.

(d) U.S. Pat. No. 4,955,523 (Carlomagno, et al.; 9/90; USCL 228/179), entitled INTERCONNECTION OF ELECTRONIC COMPONENTS, discloses a technique for interconnecting electronic components in which interconnection wires are bonded to contacts on a first component (such as a semiconductor die (1)) without the use of a material other than the materials of the contacts and the wires. The wires are then severed to a desired length of between two to twenty times the wire diameter ($2d$ to $20d$), and bonded to contacts on a second component (21) by means of a conductive material such as solder. The wires, once bonded to the first component, are severed at their desired length (by the bonding head (9) of a wirebonder) via an aperture (13) in the side wall of the bonding head. To this end, an electrode (51) is inserted into the aperture (13). As shown in this patent, the free-standing wires (7) have their ends inserted into pools (27) of conductive material such as solder in recesses of the second component. See also U.S. Pat. No. 5,189,507 (Carlomagno, et al.; 2/93; USCL 257/777), also entitled INTERCONNECTION OF ELECTRONIC COMPONENTS.

BRIEF DESCRIPTION (SUMMARY) OF THE INVENTION

It is a general object of the present invention to provide an improved technique for wirebonding, including an improved wirebonder.

It is another object of the invention to provide improved techniques for severing bond wires and for forming balls at the ends of bond wires.

According to invention, processes of severing wires and/or forming balls on the ends of wires, using electronic flame off (EFO) techniques, are enhanced by providing light during the processes. Preferably, the light is ultraviolet light.

The light illuminates at least the cathode element of the flame-off system, which may be either an EFO electrode or the wire, depending on the "polarity" of the system.

The light may be focused on the cathode element of the system, or may flood-illuminate the system.

The light may have a higher photon energy than the surface (e.g., cathode) being illuminated ("direct" photoemission), or may have a lower photon energy than the surface being illuminated ("field-assisted" photoemission).

According to a feature of the invention, prior to generating a spark to form a ball at the end of an already severed supply wire, the capillary and electrode are moved away (or vice-versa) from a previously-formed wire bond.

Other objects, features and advantages of the invention will be apparent from the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

FIG. 1 is a partially-schematic, partially-perspective view of a wire bonder, and of a bond wire having had its free end bonded to a substrate (electronic component), according to the present invention.

FIG. 1A is a timing diagram, illustrating a principle of operation of the present invention.

DETAILED DESCRIPTION OF THE INVENTION

FORMING AND SHAPING OF THE WIRE STEM

Figure 2A:
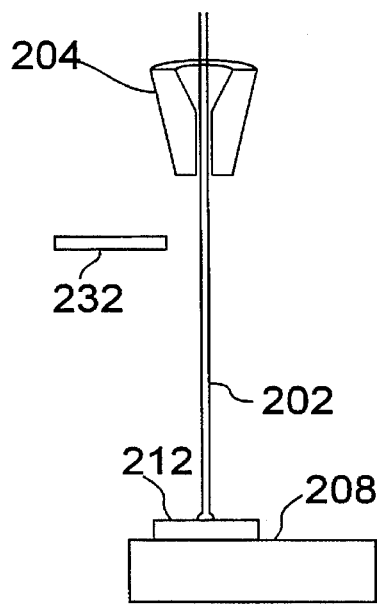
FIG. 2A is a side view of a wirebonding head (capillary) elevated above a substrate, with an electrode for performing electronic flame off (EFO) severing of the wire, according to an aspect of the present invention.

FIG. 1 illustrates a wirebonder 100 having bonded a free end 102a of a wire 102 to a terminal 104 on a surface 106a of an electronic component 106.

The wirebonder comprises a stage or chuck (not shown), a capillary 110, a positioning mechanism (POSN) 112 operably connected via a linkage 114 to the capillary 110, an electronic flame off (EFO) circuit 116, an EFO electrode 118, typically (e.g., for thermosonic wire bonding) an ultrasonic transducer (ULTR) 120, and a control mechanism (CONTROL) 122 exercising control over the aforementioned components. The wire 102 is provided from a supply spool 124 and feeds through an orifice in the capillary 110. To bond the free end 102a of the wire to a terminal 104 of an electronic component 106, the capillary 110 is moved downwards (as viewed, illustrated in dashed lines) to bond (e.g., by thermocompression) the free end 102a of the wire 102 to the terminal 104.

Once the free end (102a) of the wire (102) has been bonded to the electronic component (106), the capillary (110) is moved generally upward (in a z-axis direction) from the surface of the electronic component, and the electronic component, which typically is mounted to an x-y table (not shown) is moved in the x- and y-directions. This imparts a relative motion between the capillary and the electronic component which, in the main hereinafter, is described as the capillary being moved in three axes (x-axis, y-axis, z-axis). As the capillary (110) moves, the wire (102) "plays out" of the end of the capillary (110).

SEVERING THE WIRE

As mentioned hereinabove, once the free end (102a) of the wire (102) is bonded to the electronic component (106), and a wire bond loop is formed, the wire may be severed, leaving a new free end of the wire extending from the end of the capillary 110. Once the wire is severed, it is desirable to form a ball at the new free end thereof. This is typically performed by causing a spark between the EFO electrode 118 and the new free end of the wire.

In the figures that follow, severing a wire which has been bonded at one end only is discussed, by way of example. The utility of such a free-standing wire stem is discussed in greater detail in the Parent Case.

It should be understood that the present invention is applicable to any wirebonding operation involving EFO for severing a wire and/or for forming a ball at the new free end of a wire extending from the capillary.

According to an aspect of the invention, providing photoemission at the EFO electrode (cathode) stabilizes the arc/plasma formation and produces more reliable and predictable wire cutting (severing) behavior. This technique may be used in conjunction with negative EFO or with positive EFO.

As shown in FIG. 1, a light source 130 directs light at a location whereat the wire 102 is to be severed, such as immediately below the tip of the capillary 110. The light is shown as being focused by a lens 132. It is within the scope of this invention that the light is conveyed over a fiber optic cable, which may have a lens associated therewith. Any suitable optics (e.g., lenses, mirrors, fiber optics) may be disposed in the light path.

The electrode 118 may function either as an anode or as a cathode, in which case the wire would function as a cathode or an anode, respectively. Preferably the light is focused at the element (electrode or wire) functioning as the cathode element of the resulting cathode/anode (two element) "spark gap".

Preferably, the light from the source 130 is ultraviolet (UV) light at a wavelength of 184 nm, but the improvement to severing and/or ball formation of the present invention can be achieved with different wavelengths of light, such as 254 nm, which is appropriate for electron emission from the cathode (of the spark gap).

Figure 2B:
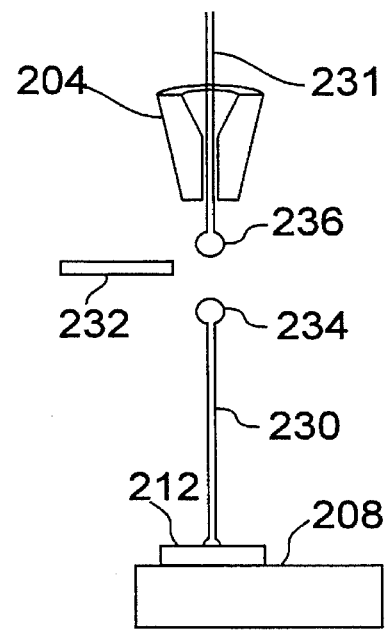
FIG. 2B is a side view of a wirebonding head (capillary) elevated above a substrate, after the wire has been severed by the technique of FIG. 2A, according to an aspect of the present invention.

As shown in greater detail in FIGS. 2A and 2B (light source 130 omitted, for illustrative clarity), a wire 202 (compare 102) which has been bonded to a terminal 212 (compare 105) on an electronic component 208 (compare 106) is severed by a spark (not shown) generated by an electrode 232 (compare 118) which is located adjacent (e.g., immediately underneath) the capillary 204 (compare 110). This results in severing the wire 202 into two portions: (a) a lower, wire stem portion 230 which is bonded to the electronic component, and (b) an upper supply portion 231 which extends from the spool (not shown, see 124 in FIG. 1) through the capillary 204 and which has a "new" feed end.

As illustrated in FIG. 2B, this results in the formation of a ball (area of increased diameter) 234 at the top (as viewed) end of the already bonded and severed wire segment 230, and results in the formation of a similar ball 236 at the new feed end of the supply wire 231. These balls 234 and 236 are important for the following reasons:

(a) optionally, the ball 234 provides a "profile" to the tip of the wire stem 230 which is advantageous for making a pressure connection to an electronic component with the tip of the wire stem 230 (in the manner described in the PARENT CASE); and (b) the ball 236 is very suitable (e.g., necessary) for making a subsequent bond between the free end of the supply wire 231 and another terminal of the electronic component (or a terminal of another electronic component).

The formation of a ball (236) on the supply side of a wire feeding from a capillary (see (b), immediately above) is not only essential for subsequent bonding of the wire, but represents a major problem to throughput. In conventional wirebonding, the process is often intended to run in a highly automated manner. It is known to ascertain whether such a ball has successfully been formed, prior to making a subsequent bond, and failure to have such a ball at the end of the feed wire will shut the process down—requiring manual intervention.

According to the present invention, the use of photoemission in conjunction with electronic flame-off severing of the wire improves ball formation and ball size distribution, and has been found to reduce the incidence of missing balls. Such photo-assisted spark severing of the wire is advantageous in the context of any (general purpose) wirebonding operation, and can be used in conjunction with various EFO circuit modifications, such as running the process under lower peak voltage conditions.

Generally, from a technical viewpoint, the technique of the present invention utilizes either "direct" (preferred) or "field-assisted" photoemission to make the breakdown (arc severing the wire) more stable and, optionally, the cutoff height (z-axis coordinate) of the cutoff more controllable. The advantages of this latter feature of being able to accurately control the cutoff height of the wire is discussed in greater detail in the PARENT CASE.

Generally, "direct" photoemission will occur when the energy of the incident light (i.e., the photons) is greater than the work function of the surface being illuminated, and "field-assisted" photoemission will occur when the work function of the surface being illuminated is greater than the energy of the incident light.

As mentioned hereinabove, the light (130, not shown in FIGS. 2A–2D) may be focused at a spot on the wire 202 whereat it is desired to sever the wire. This would be preferred for a wirebonder using positive EFO, wherein the spark starts at the wire. Alternatively, the light could flood-illuminate an area which includes the electrode 232. This would be preferred for a wirebonder using negative EFO, wherein the spark starts at the electrode 232. In either case, the use of ultraviolet light assists in the avalanche breakdown of ambient gaseous constituents, and makes it "easier" for electrons to travel from the electrode to the wire (or vice-versa). Generally, flood illumination (e.g., in the context of negative EFO) will tend to be self-selective, and may be more reliable than focused illumination (e.g., in the context of positive EFO). With flood illumination, the sharp tip of the electrode "selects" the point on the electrode whereat spark-initiation will occur.

In conventional, continuous-feed ball bonding, a high voltage arc (or EFO) is used to sever the wire intermediate each surface bonding event. The wire cutting phase of continuous ball bonding is usually accomplished by shearing of the wire after forming a secondary surface bond. In general, the finished height of the sheared wire is not critical, and so the ability of the EFO to produce a uniform height in a cut wire is not important.

In contrast to this situation, wire height uniformity is of great importance in the continuous feed resilient contact forming process of the invention disclosed in the PARENT CASE. The ability with which the cutting height of the EFO can be controlled directly influences the quality of the final result, since the uniformity and planarity of an array of contacts is a direct function of this capability.

According to an aspect of the present invention, ultraviolet light is used to stabilize the wire-cutting uniformity and spark breakdown when using a high voltage arc to sever the wires. The formation of a high voltage arc in a gas between two electrodes is an avalanche process in which an ever-increasing cascade of electrons produces more and more ionized gas molecules, until a current-carrying plasma is formed between the anode and the cathode of the discharge. Normally, initiation of the arc requires that field emission at the cathode electrode supply a small number of electrons to initiate the breakdown.

According to the present invention, an ultraviolet (UV) lamp is used to illuminate the cathode electrode in order to stimulate the production of photo-electrons at the cathode element of the EFO discharge. This lowers the threshold electric field required for emission by using UV (ultraviolet) photons of sufficient energy (e.g., 3–5 eV (electron volt)) to stimulate production of free electrons at the cathode (of the spark gap) under applied high field conditions. Generally, the energy should be limited to be below the absorption cutoff for air, or for any channeling materials (such as fiber optic cables) over which the light traverses.

The role of the spark gap cathode may be played by either the cutting electrode (negative EFO arrangement, preferred), or the continuous feed wire (positive EFO alternative embodiment). Either flood or focused UV illumination may be utilized. Focused illumination of the wire for positive EFO will localize the electron emission point on the wire and help to control the wire height by controlling the point at which the cutting plasma is first formed. Flood illumination also acts as a stabilizer of wire height, since it stabilizes the arc formation between the cathode and the electrode.

It is believed that the improvement in ball formation due to providing ultraviolet light during electronic flame off can be attributed to the following. In conventional wirebonders, the voltage at the flame-off electrode (e.g., 232) is controlled by a circuit (e.g., 234). The voltage on the electrode is increased (e.g., from zero), and drops noticeably during a firing interval (the spark acting, more-or-less, as a short circuit). The duration of the firing interval is monitored by, and when it exceeds a predetermined duration (as set by a "watchdog" type timer in the control circuitry (e.g., 222), it can be inferred that a ball has not been formed. The process is inherently somewhat indeterminate, and a plurality of "tries" can be graphed as a conventional statistical (e.g., bell-shaped) curve having a peak and a statistical variation from the peak.

FIG. 1A illustrates this phenomenon in a very general manner, wherein the horizontal axis is time, and the vertical axis is voltage (or current). At a time labeled "t0", voltage is applied by the EFO circuit (116) to the EFO electrode (118), as indicated by the line 140. A time labeled "t1" represents the onset of the spark between the electrode and the wire, and the spark current is represented by the line 142. The interval "delta-t" between t0 and t1, or delay in the onset of the spark, is the area of interest. The use of ultraviolet light in conjunction with sparking, according to the invention, tends to reduce delta-t and to narrow the distribution of delta-t values so as to be more determinate.

Viewed from another perspective, it is generally believed that the provision of ultraviolet light during EFO increases the onset time (delta-t) of spark, thereby reducing occurrences which exceed the predetermined time interval and increasing the likelihood of ball formation within the prescribed time interval. Hence, providing ultraviolet light during electronic flame off not only shortens onset time of the spark, but significantly reduces time-outs indicative of failure to create a ball.

Although the invention has been described in the context of severing the wire immediately below the tip of the capillary using electronic flame off (EFO) techniques, it is well within the scope of this invention that the wire can be severed using other instrumentalities, such as by mechanical means, and at other locations such as within the capillary (see, e.g., the aforementioned U.S. Pat. No. 4,955,523, wherein the wire is severed within the capillary (bonding head)). If, however, it is desired to impart a ball shape to the end of the wire stem, additional steps (separate ball formation) would need to be performed.

Two-Step Process

According to an aspect of the invention, wire melting and ball formation are performed in two separate, sequential steps (rather than combined in one step). Wire stems are first melted (severed) by a first EFO discharge, then balls are formed at their ends (tips) by a second EFO discharge. In the context of forming free-standing wire stems, this results in tighter wire height distribution, which is important in ensuring coplanarity of the tips of a plurality of wire stems, a feature of the invention which is discussed in greater detail hereinbelow.

Figure 2C:
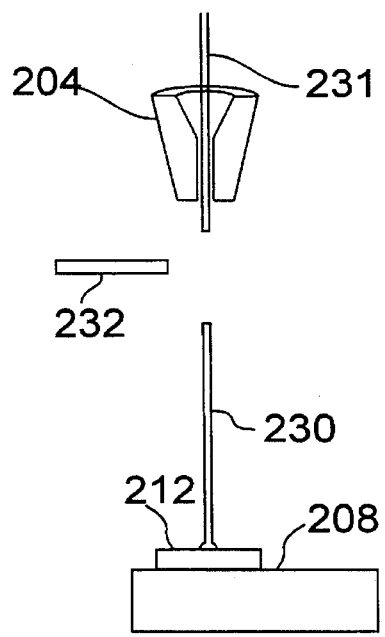
FIG. 2C is a side view of a wirebonding head (capillary) elevated above a substrate, after the wire has been severed by an alternate (to FIG. 2B) technique, according to an aspect of the present invention.

FIG. 2C shows a wire stem that has been severed by an arc from an electrode 232 to have a stem portion 230 extending from a surface of a substrate 208 and a feed portion 231. In this case, the intensity of the arc is controlled (minimized) so as to be just sufficient to sever the wire, without causing balls of significant size (compare 234 and 236 of FIG. 2B) to be formed. Balls comparable to the balls 234 and 236 shown in FIG. 2B can be formed in subsequent processing steps, using any suitable technique for forming balls. It is within the scope of this invention that a ball is formed on the tip of the supply portion (e.g., 231) wire, without forming a ball on the tip of the stem portion (e.g., 230) of the wire.

Figure 2D:
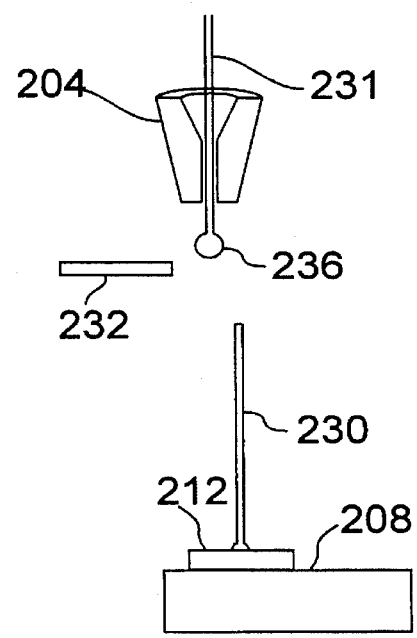
FIG. 2D is a side view of a wirebonding head (capillary) elevated above a substrate, after the wire has been severed by an alternate (to FIGS. 2B and 2C) technique, according to an aspect of the present invention.

FIG. 2D illustrates employing a tendency for the wire stem to springback (when severed) to advantage, in controlling the formation of a ball on the tip of the supply portion 231 of the wire. Prior to generating a spark at the electrode 232, the capillary 204 is moved approximately 0.5 mm (millimeters) in the X or Y direction. (More accurately, it would be the substrate that is moved by an X-Y table.) The EFO electrode 232 moves with the capillary 204. In this figure, the capillary and EFO are illustrated as being moved to the left, relative to the wire stem portion 230 of the wire. This lateral displacement of the capillary/EFO will cause the wire stem portion 230 to snap to the right (as viewed) when the wire is severed. This has a number of significant advantages, including:

(a) by moving the capillary prior to sparking, the wire is pre-loaded, and is "poised" to sever itself at the least provocation (e.g., the spark). This is analogous to stretching a string tight prior to cutting the string with a knife.

(b) the wire stem portion (430) typically representing the shortest path to ground, causing the wire stem portion to snap away from the EFO electrode (432) immediately upon the wire becoming severed will result in the supply portion (431) being the shortest path to ground. Generally, the spark provided by the EFO electrode will "seek" the shortest path to ground. In this manner, ball formation at the tip of the supply portion of the wire is more reliably controlled.

As mentioned hereinabove, failure to create a ball at the tip of the supply portion of the wire, for subsequent bonding, will result in shutdown of the process. A more subtle problem is that balls (e.g., 236) of indeterminate size, although adequate for initiating bonding, can result in indeterminate z-axis control over the wirebonding process. Not only is there supposed to be a ball at the end of the supply wire, but it is also expected to be of a certain, repeatable size. The techniques of the present invention (e.g., ultraviolet light, pre-loading the wire) not only help assure ball formation, but also ensure more uniformity in the size of the balls formed during severing the wire.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

What is claimed is:

1. Method of performing wirebonding, comprising:
    bonding a bond wire to a terminal of an electronic component with a capillary;
    playing the bond wire out of the capillary;
    severing the bond wire with a discharge from an electrode; and
    while severing the bond wire, illuminating at least one of the electrode and the bond wire with ultraviolet light.

2. Method, according to claim 1, wherein:
    the electrode and the bond wire function, in use, as a spark gap, and a one of the electrode and the bond wire function as a cathode of the spark gap; and
    the ultraviolet light is directed at the cathode of the spark gap.

3. Method, according to claim 1, wherein:
    the ultraviolet light has a wavelength of 184 nanometers (nm).

4. Method, according to claim 1, wherein:
    the ultraviolet light is caused to flood-illuminate the electrode and the wire.

5. Method, according to claim 1, wherein:
    the ultraviolet light is focused on the at least one of the electrode and the bond wire.

6. Method of forming a ball at an end of a wirebond wire, comprising:
    causing an electrical discharge between an electrode and a bond wire; and
    while causing the electrical discharge, illuminating at least one of the electrode and the bond wire with ultraviolet light.

7. Method, according to claim 6, wherein:
    the electrode and the bond wire function, in use, as a spark gap, and a one of the electrode and the bond wire function as a cathode of the spark gap; and
    the ultraviolet light is directed at the cathode of the spark gap.

8. Method, according to claim 6, wherein:
    the ultraviolet light has a wavelength of 184 nanometers (nm).

9. Method, according to claim 6, wherein:
    the ultraviolet light is caused to flood-illuminate the electrode and the wire.

10. Method, according to claim 6, wherein:
    the ultraviolet light is focused on the at least one of the electrode and the bond wire.

11. Method of severing and forming balls at the end of bond wires, comprising:
    bonding a bond wire to a terminal of an electronic component with a capillary of a wire bonder;
    with an electrode, causing a first electrical discharge to sever the bond wire so that a first portion of the bond wire is bonded to the electronic component and a second portion of the bond wire extends from the capillary of the wire bonder;
    causing a second electrical discharge to form a ball at the end of second portion of the bond wire; and
    while performing at least one of the first electrical discharge and the second electrical discharge, illuminating at least one of the electrode and the bond wire with ultraviolet light.

12. Method, according to claim 11, wherein:
    the electrode and the bond wire function, in use, as a spark gap, and a one of the electrode and the bond wire function as a cathode of the spark gap; and
    the ultraviolet light is directed at the cathode of the spark gap.

13. Method, according to claim 11, wherein:
    the ultraviolet light has a wavelength of 184 nanometers (nm).

14. Method, according to claim 11, wherein:
    the ultraviolet light is caused to flood-illuminate the electrode and the wire.

15. Method, according to claim 11, wherein:
    the ultraviolet light is focused on the at least one of the electrode and the bond wire.

16. Wirebonder for bonding wires to terminals of electronic components, comprising:
    a capillary for feeding and bonding a wire;
    an EFO electrode;
    an ultraviolet light source; and
    means for directing light from the ultraviolet light source towards at least one of the EFO electrode and the wire.

17. Wirebonder, according to claim 16, wherein:
    the EFO electrode and the wire function, in use, as a spark gap, a one of the EFO electrode and the wire functioning as a cathode of the spark gap; and
    the light is directed at the cathode of the spark gap.

18. Wirebonder, according to claim 16, wherein:
    the ultraviolet light has a wavelength of 184 nanometers (nm).

19. Wirebonder, according to claim 16, wherein:
    the ultraviolet light is caused to flood-illuminate the electrode and the wire.

20. Wirebonder, according to claim 16, wherein:
    the ultraviolet light is focused on the at least one of the electrode and the bond wire.

21. Method of controlling formation of a spark between an electrode of a wire bonder and a wire supplied by the wire bonder, comprising:
    prior to initiating a spark between an electrode and a wire of a wire bonder, illuminating at least one of the electrode and the wire with light having a characteristic which will enhance formation of the spark;
    wherein:
        the light is ultraviolet light.

22. Method, according to claim 21, wherein:
    the light has a wavelength of 184 nanometers (nm).

23. Method, according to claim 21, wherein:
    the light is caused to flood-illuminate the electrode and the wire.

24. Method, according to claim 21, wherein:
    the light is focused on the electrode.

25. Method, according to claim 21, wherein:
    the electrode and the bond wire function, in use, as a spark gap, and a one of the electrode and the bond wire function as a cathode of the spark gap; and
    the ultraviolet light is directed at the cathode of the spark gap.

26. Method of stabilizing wire-cutting uniformity and spark breakdown in a wire bonder, comprising with an electrode, providing a high voltage arc to sever the wire; and in conjunction with providing the high voltage, providing light in a region where it is desired to form the high voltage arc;

wherein:

the light is ultraviolet light.

27. Method, according to claim 26 wherein: the light has a wavelength of 184 nanometers (nm).

28. Method, according to claim 26, wherein:

the light is caused to flood-illuminate the region where it is desired to form the high voltage arc.

29. Method, according to claim 26, wherein:

the light is focused on at least one of the wire and the electrode.

30. Method, according to claim 26, wherein:

the electrode and the wire function, in use, as a spark gap, and a one of the electrode and the wire function as a cathode of the spark gap; and the ultraviolet light is directed at the cathode of the spark gap.

31. Method of stimulating production of photo-electrons at a cathode element of an EFO system of a wire bonder, comprising:

illuminating the cathode element of the EFO component with ultraviolet light having sufficient energy to stimulate the production of photo-electrons at the cathode element.

32. Method, according to claim 31, further comprising:

limiting the light energy to be below the absorption cutoff for any medium between a light source providing the light energy and the cathode element.

33. Method, according to claim 31, wherein:

the cathode element has a work function; and the light energy is greater than the work function of the cathode element.

34. Method, according to claim 31, wherein:

the cathode element has a work function; and the work function of the cathode element is greater than the light energy.

\* \* \* \* \*